(12) United States Patent
Fang et al.

(10) Patent No.: US 10,999,943 B2
(45) Date of Patent: May 4, 2021

(54) DISPLAY PANEL AND DISPLAY DEVICE

(71) Applicant: BOE Technology Group Co., Ltd., Beijing (CN)

(72) Inventors: Deli Fang, Beijing (CN); Shuo Chen, Beijing (CN); Tailiang Li, Beijing (CN); Junmin Sun, Beijing (CN); Ken Wen, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/544,077

(22) Filed: Aug. 19, 2019

(65) Prior Publication Data

US 2020/0196467 A1   Jun. 18, 2020

(30) Foreign Application Priority Data

Dec. 18, 2018 (CN) .......................... 201822132087.4

(51) Int. Cl.
  *G06F 1/16* (2006.01)
  *H05K 5/02* (2006.01)
  *H05K 7/14* (2006.01)
  *H05K 5/00* (2006.01)

(52) U.S. Cl.
  CPC ......... *H05K 5/0221* (2013.01); *G06F 1/1637* (2013.01); *H05K 5/0017* (2013.01); *H05K 7/1401* (2013.01)

(58) Field of Classification Search
  CPC ..... G06F 1/1632; G06F 1/1637; G06F 1/1654
  See application file for complete search history.

(56) References Cited

U.S. PATENT DOCUMENTS

| | | | | |
|---|---|---|---|---|
| 4,950,072 A | * | 8/1990 | Honda | G09F 9/35 353/122 |
| 5,121,296 A | * | 6/1992 | Hsu | G06F 1/183 361/679.35 |
| 5,353,201 A | * | 10/1994 | Maeda | H05K 9/0033 174/362 |
| 5,383,098 A | * | 1/1995 | Ma | H04B 1/3833 174/371 |
| 5,560,572 A | * | 10/1996 | Osborn | H05K 7/1421 248/27.3 |
| 5,570,267 A | * | 10/1996 | Ma | G02F 1/133308 349/58 |
| 5,613,237 A | * | 3/1997 | Bent | H04B 1/086 220/4.02 |
| 5,929,950 A | * | 7/1999 | Matsuda | G02F 1/133308 349/60 |
| 6,075,694 A | * | 6/2000 | Mills | G06F 1/187 312/223.2 |

(Continued)

*Primary Examiner* — Adrian S Wilson
(74) *Attorney, Agent, or Firm* — Muncy, Geissler, Olds & Lowe, P.C.

(57) ABSTRACT

The present disclosure relates to the field of display technology, and provides a display panel and a display assembly. The display panel includes a front surface, a back surface arranged opposite to the front surface, and a side surface between the front surface and the back surface. The front surface includes a display region. At least one first clamping structure is arranged at the side surface of the display panel. The first clamping structure includes a first protrusion and a first elastic structure, and the first protrusion is arranged on the corresponding first elastic structure.

18 Claims, 2 Drawing Sheets

(56) References Cited

U.S. PATENT DOCUMENTS

| | | | | | |
|---|---|---|---|---|---|
| 6,111,760 | A * | 8/2000 | Nixon | H05K 5/0013 220/4.02 |
| 6,507,377 | B1 * | 1/2003 | Jung | G02F 1/133308 349/58 |
| 6,654,078 | B1 * | 11/2003 | Kato | G02F 1/133308 349/58 |
| 6,894,739 | B2 * | 5/2005 | Sung | G02F 1/133308 349/58 |
| 6,908,338 | B2 * | 6/2005 | Okamoto | G06F 1/182 439/607.02 |
| 7,209,195 | B2 * | 4/2007 | Lin | G02F 1/133308 349/58 |
| 7,429,700 | B2 * | 9/2008 | Kanamaru | H01R 13/506 174/135 |
| 7,570,313 | B2 * | 8/2009 | Wu | G02F 1/133308 348/836 |
| 7,924,360 | B2 * | 4/2011 | Cheng | G02F 1/133308 349/58 |
| 8,213,182 | B2 * | 7/2012 | Aoki | H05K 5/0269 361/752 |
| 8,223,291 | B2 * | 7/2012 | Kim | G02F 1/133308 349/58 |
| 8,254,098 | B2 * | 8/2012 | Liu | H04M 1/0249 361/679.02 |
| 8,480,186 | B2 * | 7/2013 | Wang | H05K 5/0013 312/223.1 |
| 2003/0213884 | A1 * | 11/2003 | Ikunami | B60R 11/0235 248/346.01 |
| 2006/0146486 | A1 * | 7/2006 | Wikstrom | G02F 1/133308 361/679.26 |
| 2007/0064378 | A1 * | 3/2007 | Lo | G06F 1/1601 361/679.22 |
| 2007/0236465 | A1 * | 10/2007 | Chou | G06F 1/1601 345/173 |
| 2008/0048958 | A1 * | 2/2008 | Kim, II | G02F 1/133308 345/87 |
| 2008/0123271 | A1 * | 5/2008 | Shu | H05K 5/02 361/679.01 |
| 2008/0165485 | A1 * | 7/2008 | Zadesky | H04M 1/0252 361/679.02 |
| 2008/0247127 | A1 * | 10/2008 | Finnegan | H05K 5/0217 361/679.02 |
| 2009/0295741 | A1 * | 12/2009 | Cheng | H05K 5/02 345/173 |
| 2010/0053882 | A1 * | 3/2010 | Hayashi | H04B 1/3822 361/679.43 |
| 2010/0061044 | A1 * | 3/2010 | Zou | B32B 3/02 361/679.01 |
| 2011/0049139 | A1 * | 3/2011 | Jiang | G06F 1/1626 220/4.01 |
| 2011/0209376 | A1 * | 9/2011 | Kinno | G06F 1/1601 40/790 |
| 2012/0106035 | A1 * | 5/2012 | Chen | G06F 1/1633 361/679.01 |
| 2013/0027862 | A1 * | 1/2013 | Rayner | G06F 1/1656 361/679.3 |
| 2015/0092337 | A1 * | 4/2015 | Tan | G06F 1/181 361/679.31 |

* cited by examiner

DISPLAY PANEL AND DISPLAY DEVICE

CROSS-REFERENCE TO RELATED APPLICATION

The present application claims a priority of the Chinese patent application No. 201822132087.4 filed on Dec. 18, 2018, which is incorporated herein by reference in its entirety.

TECHNICAL FIELD

The present disclosure relates to the field of display technology, in particular to a display panel and a display device.

BACKGROUND

As a display device capable of displaying paintings, a painting display device is used to simulate the paintings. The painting display device includes a painting display panel for display, and the painting display panel is assembled with a wood frame which seems like a photo frame, so the painting display device is more like a painting as a whole.

SUMMARY

In one aspect, the present disclosure provides in some embodiments a display panel, including a front surface, a back surface arranged opposite to the front surface, and a side surface between the front surface and the back surface. The front surface includes a display region. At least one first clamping structure is arranged at the side surface of the display panel. The first clamping structure includes a first protrusion and a first elastic structure, and the first protrusion is arranged on the corresponding first elastic structure.

In a possible embodiment of the present disclosure, the first protrusion includes a first oblique surface, the first oblique surface faces toward the front surface and is extended from a bottom of the first protrusion toward a top of the first protrusion in a direction from the front surface to the back surface.

In a possible embodiment of the present disclosure, the display panel includes a housing and a display module arranged in the housing. The housing includes a middle frame and a rear cover connected to the middle frame. The middle frame includes a front member arranged at the front surface of the display panel and a side member arranged at the side surface of the display panel, and the middle frame is provided with an opening facing the back surface. The rear cover includes a back member arranged at the back surface of the display panel. A region surrounded by the front member is configured to expose a display surface of the display module to form the display region; the rear cover is connected to the middle frame, closes the opening on a back side of the middle frame and form the back surface of the display panel; the rear cover encloses the entire back surface of the display module on the side opposite to the display surface within the housing. The side member is provided with at least one group of first slits, each of the at least one group of first slits includes two first slits spaced apart from each other, one end of each first slit extends to the opening, and a portion of the side member between the two first slits in each group of first slits forms the first elastic structure.

In a possible embodiment of the present disclosure, the middle frame further includes first retainer walls corresponding to the first elastic structures respectively. Each first retainer wall is arranged at a side of the front member facing the back surface, two ends of the first retainer wall are connected to the side member outside the corresponding group of first slits respectively, and a side of each first retainer wall away from the front member is in contact with the rear cover. Each first retainer wall is in engagement with the rear cover to define a partially closed space inside each of the at least one group of first slits.

In a possible embodiment of the present disclosure, the side surface includes a first side surface and a second side surface arranged opposite to the first side surface, and each of the first side surface and the second side surface includes the first clamping structure.

In a possible embodiment of the present disclosure, the side surface further includes a third side surface and a fourth side surface arranged opposite to the third side surface, each of the third side surface and the fourth side surface is located between and connected with the first side surface and the second side surface, the first clamping structures are arranged at each of the third side surface and the fourth side surface.

In a possible embodiment of the present disclosure, the first clamping structures arranged at the two opposite side surfaces are symmetric relative to each other about a central axis of the display panel.

In a possible embodiment of the present disclosure, the side surface of the display panel includes a plurality of first elastic structures, the plurality of first elastic structures is arranged at each side surface of the display panel, and the first protrusion is arranged on each of the first elastic structures.

In a possible embodiment of the present disclosure, a plurality of first protrusions is arranged on each of the first elastic structures.

In a possible embodiment of the present disclosure, at least one second clamping structure is arranged on the side surface of the display panel; the second clamping structure includes a second protrusion and a second elastic structure arranged on a side surface of the display panel; the second protrusion is arranged on the second elastic structure.

In another aspect, the present disclosure provides in some embodiments a display assembly, including the above mentioned display panel and a frame at least surrounding the side surface of the display panel. The frame is arranged at least around the side surface in the case that the frame is connected to the display panel. The first clamping structure of the display panel is configured to be in physical contact with an inner side of the frame and keep a force between the first clamping and the inner side of the frame to enable the frame to be connected to the display panel. A top of the first protrusion is in contact with the inner side of the frame, and the first elastic structure is elastically deformed to change the force applied by the first protrusion to the inner side of the frame.

In a possible embodiment of the present disclosure, the top of the first protrusion is a first contact surface. The first contact surface is in surface contact with the inner side of the frame and keeps a force between the first clamping and the inner side of the frame.

In a possible embodiment of the present disclosure, at least one second clamping structure is arranged on the side surface of the display panel. The second clamping structure includes a second protrusion and a second elastic structure. The second protrusion is arranged on the second elastic structure. The frame includes at least one groove, and the groove is arranged on the inner side of the frame. The number and position of the grooves on the inner side of the frame respectively correspond to the number and position of the second clamping structures of the display panel. The second protrusion of the second clamping structure is clamped into the groove.

In a possible embodiment of the present disclosure, the second protrusion is provided with a second oblique surface facing toward the front surface and extending from a bottom of the second protrusion toward a top of the second protrusion in a direction from the front surface to the back surface.

In a possible embodiment of the present disclosure, the second oblique surface comprises a plurality of concave.

In a possible embodiment of the present disclosure, the display panel includes a housing and a display module arranged in the housing. The housing includes a middle frame and a rear cover connected to the middle frame. The middle frame includes a front member arranged at the front surface of the display panel and a side member arranged at the side surface of the display panel, and the middle frame is provided with an opening facing the back surface. The rear cover includes a back member arranged at the back surface of the display panel. The side member is provided with at least a group of second slits. Each group of the second slits includes two second slits spaced apart from each other. One end of each second slit extends to the opening. A portion of the side member between two second slits in each group of the second slits forms the second elastic structure.

In a possible embodiment of the present disclosure, the middle frame further includes second retainer walls corresponding to the second elastic structures respectively. Each second retainer wall is arranged at a side of the front member facing the back surface. Two ends of the second retainer wall are connected to the side member outside the corresponding group of second slits respectively. A side of each second retainer wall away from the front member is in contact with the rear cover. Each second retainer wall is in engagement with the rear cover to define a partially closed space inside each group of second slits.

In a possible embodiment of the present disclosure, each second protrusion is provided with a second contact surface facing the back surface, the groove is provided with a third contact surface to be in surface contact with the second contact surface, and the frame further includes a clamping member in contact with the front surface of the display panel.

In a possible embodiment of the present disclosure, the clamping member is of a complete ring shape in a plane parallel to the front surface.

In a possible embodiment of the present disclosure, the frame is made of wood.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

Figure 1:
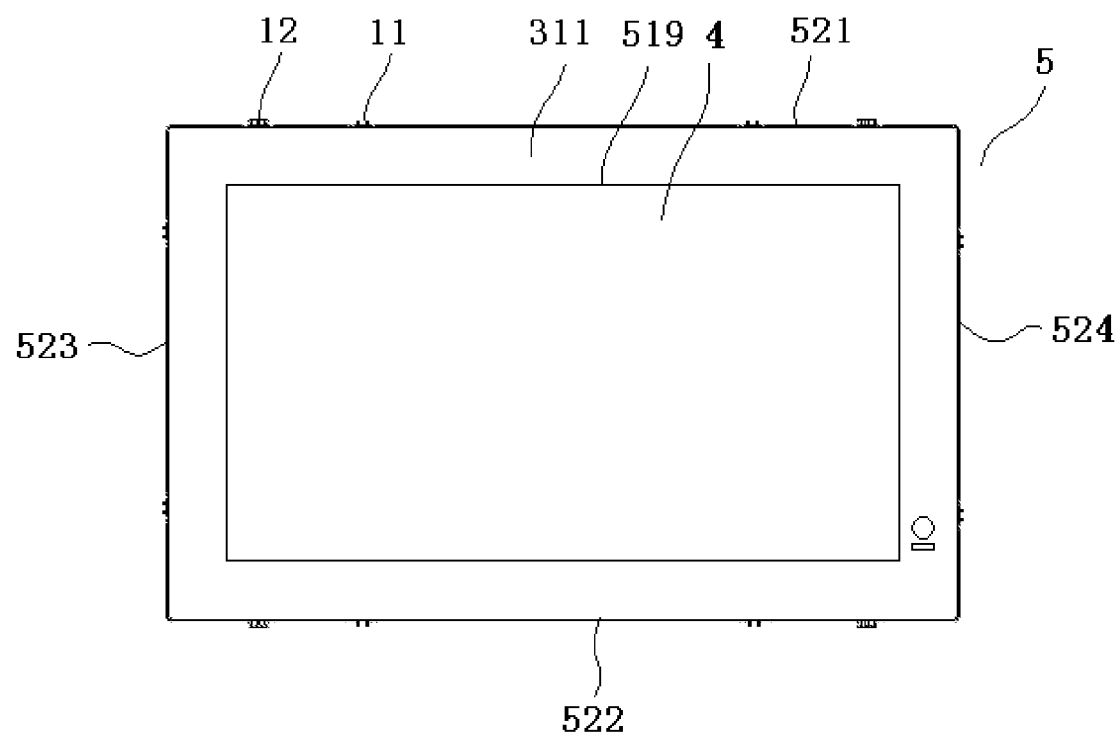
FIG. 1 is a top view of a display panel according to one embodiment of the present disclosure.

The present disclosure will be described hereinafter in conjunction with the drawings and embodiments. The following embodiments are for illustrative purposes only, but shall not be used to limit the scope of the present disclosure. It should be appreciated that, the embodiments and the features in the embodiments may be combined in any form in the case of no conflict. For ease of description, merely the members related to the present disclosure are shown in the drawings.

In the related art, the painting display panel is assembled with the wood frame in a clamping manner, and the wood frame is made of wood. Due to the limitation of a woodworking process, the dimensional precision of the wood frame is not so high, so a gap easily occurs between a side surface of the painting display panel and an inner side of the wood frame. At this time, the two may shake relative to each other, so the user experience may be adversely affected, and even the wood frame may probably be broken and the manufacture cost may increase.

An object of the present disclosure is to provide a display panel and a display device, so as to prevent the display panel from shaking relative to a frame.

As shown in FIGS. 1 to 4, the present disclosure provides in some embodiments a display panel 5, which includes a front surface 51, a back surface 53 arranged opposite to the front surface 51, and a side surface 52 between the front surface 51 and the back surface 53. The front surface 51 and the back surface 53 are connected by the side surface 52. A display region 519 is provided at the front surface 51.

At least one first clamping structure is provided at the side surface 52 of the display panel 5. The first clamping structure is configured to be physical contact with an inner side of a frame 6 and keep a certain force between the first clamping and the inner side of the frame 6, so as to enable the frame 6 to be connected to the display panel 5. The frame 6 is arranged in such a manner as to at least surround the side surface 52 in the case that the frame 6 is connected to the display panel 5.

The first clamping structure includes first protrusions 11 and first elastic structures 21, and each first protrusion 11 is arranged on the corresponding first elastic structure 21. A top of each first protrusion 11 is in contact with the inner side of the frame 6. The first elastic structure 21 is enabled to be elastically deformed so as to change a force applied by the first protrusion 11 to the inner side of the frame 6. In this way, the first clamping structure abuts against the inner side of the frame 6, so that the display panel 5 to be clamped into the frame 6.

As shown in FIG. 1, the display region 519 for display may be provided at the front surface 51 of the display panel 5, and the first clamping structure clamped into the frame 6 may be provided at the side surface 52 connected to the front surface 51. In this way, it is able to connect the frame 6 to the display panel 5 in a clamping manner.

Figure 2:
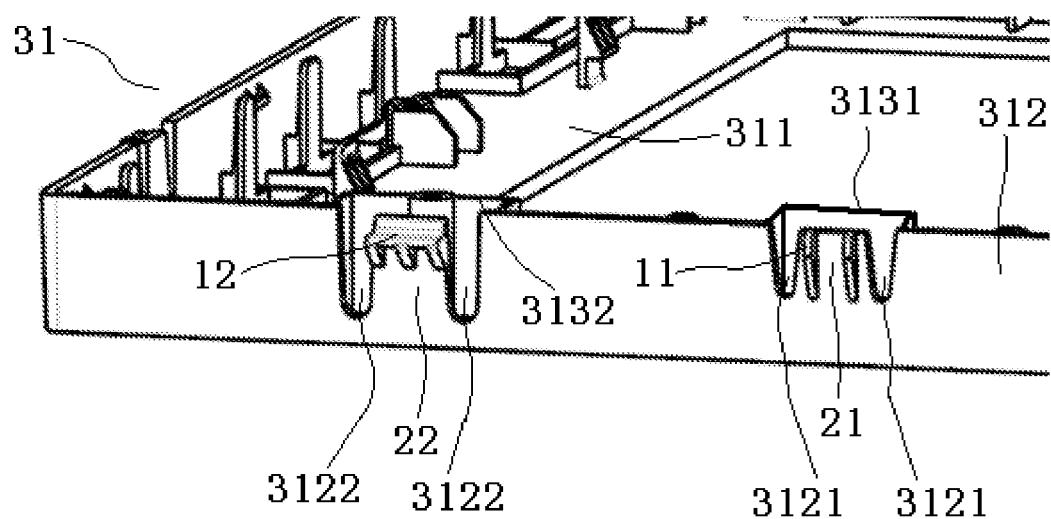
FIG. 2 is a topical schematic view showing a middle frame of the display panel according to one embodiment of the present disclosure.
Figure 3:
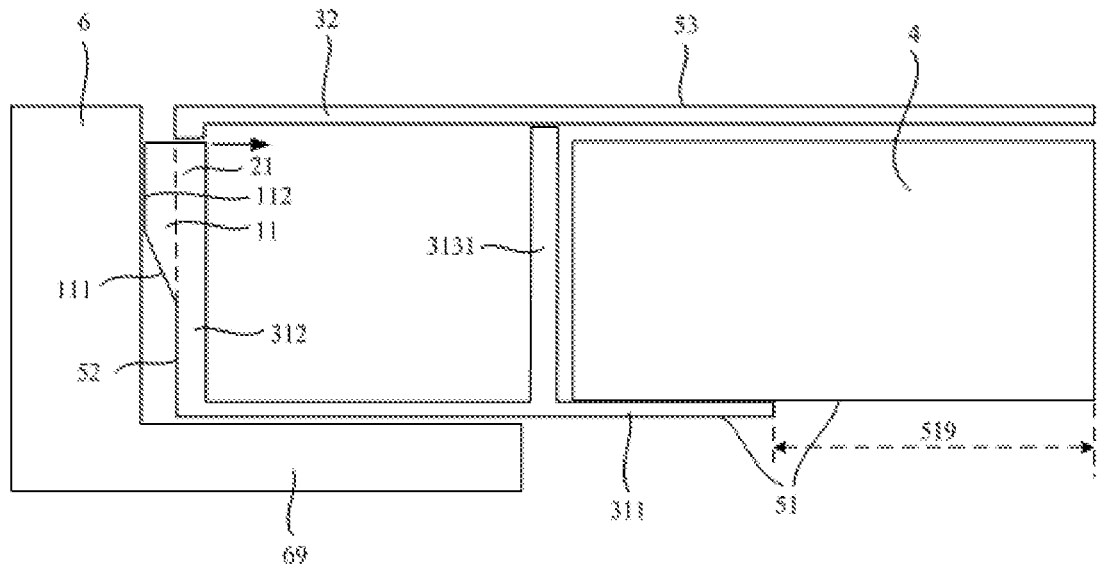
FIG. 3 is a topical sectional view of a display device at a first protrusion according to one embodiment of the present disclosure.

As shown in FIG. 2, the first protrusions each arranged on the corresponding first elastic structure 21 may be provided at the side surface 52 of the display panel 5. As shown in FIG. 3, through the elastic deformation of the first elastic structure 21, the first protrusion 11 may move within a certain range (i.e., in a left-right direction in FIG. 3). Hence, when a size of the frame 6 (e.g., a wood frame) changes within a certain range, the first protrusion 11 may always abut against the inner side of the frame 6 (in a direction toward the side surface of the display panel 5), so as to prevent the display panel 5 from shaking relative to the frame 6 (i.e., in the left-right direction in FIG. 3). As a result, it is able to improve the user experience, prevent the frame 6 from being broken, increase the yield, and reduce the manufacture cost.

In a possible embodiment of the present disclosure, the display panel 5 may be a painting display panel.

In a possible embodiment of the present disclosure, the frame 6 may be made of wood.

In a possible embodiment of the present disclosure, the display panel 5 may be a painting display panel of a painting display device for simulating a painting. The frame 6 may be made of wood. Due to the limitation of a woodworking process, usually dimensional precision of a wood frame is relatively low and relative shaking easily occurs, so the scheme in the embodiments of the present disclosure is more suitable.

Of course, the display panel 5 may also be any product or member having a display function, e.g., liquid crystal display (LCD), organic light-emitting diode (OLED) display panel, electronic paper, mobile phone, flat-panel computer, television, display, laptop computer, digital photo frame or navigator. The frame 6 may also be made of any other appropriate materials, such as plastics or metal.

In a possible embodiment of the present disclosure, each first protrusion 11 may be provided with a first oblique surface 111 facing the front surface 51 and extending from a bottom of the first protrusion 11 toward a top of the first protrusion 11 in a direction from the front surface 51 to the back surface 53.

In other words, as shown in FIG. 3, a surface of each first protrusion 11 facing the front surface 51 (i.e., a surface facing downward in FIG. 3) maybe the first oblique surface 111, or each first protrusion 11 may be a wedge-like structure with its pointed end facing the front surface 51. Hence, when the display panel 5 is to be assembled with the frame 6, the display panel 5 may be pushed from a back surface of the frame 6, so as to enable the first oblique surface 111 to be in contact with the frame 6 due to the elastic deformation of the first elastic structure 21, thereby to enable the first protrusion 11 to gradually slide into the frame 6. As a result, it is able to facilitate the assembling thereof.

In a possible embodiment of the present disclosure, the top of each first protrusion 11 may be a first contact surface 112. In the case that the frame 6 is connected to the display panel 5, the first contact surface 112 may be in contact with the inner side of the frame 6.

Obviously, as shown in FIG. 3, the top of each first protrusion 11 (i.e., a left side of the first protrusion 11 in FIG. 3) may be in contact with the inner side of the frame 6. In a possible embodiment, the top of each first protrusion 11 may be the first contact surface 112 to be in contact with the inner side of the frame 6. In this way, it is able to increase a contact area, thereby to provide a stable contact.

In a possible embodiment of the present disclosure, the display panel 5 may include a housing and a display module 4 arranged in the housing. The housing may include a middle frame 31 and a rear cover 32 connected to the middle frame 31. The middle frame 31 may include a front member 311 arranged at the front surface 51 of the display panel 5 and a side member 312 arranged at the side surface 52 of the display panel 5, and the middle frame 31 may be provided with an opening facing the back surface 53. The rear cover 32 may include a back member arranged at the back surface 53 of the display panel 5. The side member 312 may be provided with at least a group of first slits 3121, each group of first slits 3121 may include two first slits 3121 spaced apart from each other, one end of each first slit 3121 may extend to the opening, and a portion of the side member 312 between the two first slits 3121 in each group of first slits 3121 may form the first elastic structure 21.

As shown in FIG. 3, the display panel 5 may include the housing, and the display module 4 for display may be arranged inside the housing. The housing may include the middle frame 31 and the rear cover 32. The front member 311 of the middle frame 31 may form a peripheral portion of the front surface 51 of the display panel 5, and a region surrounded by the front member 311 is configured to expose a display surface of the display module 4, so as to form the display region 519; the rear cover 32 encloses the entire back surface 53 of the display module 4 on the side opposite to the display surface within the housing. The side member 312 of the middle frame 31 may be connected to the front member 311 and form the side surface 52 of the display panel 5. The rear cover 32 may be connected (e.g., clamped, or in threaded connection) to the middle frame 31, so as to close an opening at a rear side of the middle frame 31 and form the back surface 53 of the display panel 5.

As shown in FIG. 2, the side member 312 may be provided with a group of first slits 3121 corresponding to each first elastic structure 21. Each group of first slits 3121 may include two first slits 3121 spaced apart from each other, and one end of each first slit 3121 may be connected to the opening at the back surface of the middle frame 31. Hence, the portion of the side member 312 between the two first slits 3121 is relatively free, so as to form the first elastic structure 21. The first elastic structure 21 is capable of being elastically deformed, so as to drive the first protrusion 11 on the first elastic structure 21 to move.

In a possible embodiment of the present disclosure, the middle frame 31 may further include first retainer walls 3131 corresponding to the first elastic structures 21 respectively. Each first retainer wall 3131 may be arranged at a side of the front member 311 facing the back surface 53, two ends of the first retainer wall 3131 may be connected to the side member 312 outside the corresponding group of first slits 3121 respectively, and a side of each first retainer wall 3131 away from the front member 311 may be in contact with the rear cover 32.

As shown in FIGS. 2 and 3, the front member 311 of the middle frame 31 may be further provided with the first retainer walls 3131 at a side away from the back surface 53. Each first retainer wall 3131 may be connected to the side member 312 at a position outside the corresponding group of first slits 3121. Hence, the first retainer wall 3131 may be in engagement with the rear cover 32 to define a partially closed space inside each group of first slits 3121, thereby to prevent moisture and oxygen from entering the display panel 5 due to the first slits 3121.

In a possible embodiment of the present disclosure, the side surface 52 may include a first side surface 521 and a second side surface 522 arranged opposite to the first side surface 521, and each of the first side surface 521 and the second side surface 522 may be provided with the first protrusion 11.

In a possible embodiment of the present disclosure, the side surface 52 may further include a third side surface 523 and a fourth side surface 524 arranged opposite to the third side surface 523, each of the third side surface 523 and the fourth side surface 524 may be located between and connected with the first side surface 521 and the second side surface 522, and each of the third side surface 523 and the fourth side surface 524 may be provided with the first protrusion 11.

As shown in FIG. 1, in a possible embodiment of the present disclosure, each of the two opposite side surfaces 52 of the display panel 5 may be provided with the first protrusion 11, so as to secure the display panel 5 through the first protrusions 11 in two opposite directions in a better manner.

Further, the display panel 5 may be of a cuboidal shape as a whole, and the two groups of opposite side surfaces 52 may each be provided with the first protrusion 11, so as to secure the display panel 5 in various directions.

In a possible embodiment of the present disclosure, a plurality of first elastic structures 21 may be arranged at each side surface 52 of the display panel 5, and the first protrusion 11 may be arranged on each first elastic structure 52.

In a possible embodiment of the present disclosure, a plurality of first protrusions 11 may be arranged on each first elastic structure 21.

In other words, as shown in FIG. 1, the plurality of first elastic structures 21 may be arranged at different positions on each side surface 52, and the first protrusions 11 may be arranged on each first elastic structure 21, so as to secure each side surface 52 at different positions in a better manner. In a possible embodiment of the present disclosure, the first elastic structures 21 on the two opposite side surfaces 52 may be symmetric relative to each other about a central axis of the display panel 5. As shown in FIG. 2, the plurality of first protrusions 11 may be arranged on each first elastic structure 21 and spaced apart from each other, so as to improve a support effect.

For example, as shown in FIGS. 1 and 2, two first elastic structures 21 may be arranged on each side surface 52, and two first protrusions 11 may be arranged on each first elastic structure 21. In a possible embodiment of the present disclosure, the first elastic structures 21 on the two opposite side surfaces 52 may be symmetric relative to each other about the central axis of the display panel 5.

The present disclosure further provides in some embodiments a display device, which includes the above-mentioned display panel 5, and the frame 6 at least surrounding the side surface 52 of the display panel 5.

In other words, the display panel 5 may be assembled with the frame 6 to form the display device having various functions. For example, a painting display panel may be assembled with a wood frame, so as to form a painting display device.

In a possible embodiment of the present disclosure, the side surface of the display panel 5 is provided with at least one second clamping structure; the second clamping structure includes a second protrusion 12 and a second elastic structure arranged on the side surface 52 of the display panel 5. The second protrusion 12 is arranged on the second elastic structure 22. At least one groove 61 is arranged on the inner side of the frame 6. The number and position of the grooves 61 on the inner side of the frame 6 respectively correspond to the number and position of the second clamping structures of the display panel 5. The second protrusion 12 of the second clamping structure is clamped into the groove 61.

In other words, the second protrusion 12 is different from the first protrusion 11. The groove 61 corresponding to the second protrusion 12 may be formed at the inner side of the frame 6. In this way, the second protrusion 12 may be clamped into the groove 61, rather than abutting against the inner side of the frame 6.

In a possible embodiment of the present disclosure, the second protrusion 12 may be arranged on the corresponding second elastic structure 22. The second protrusion 12 may be provided with a second oblique surface 121 facing the front surface 51 and extending from a bottom of the second protrusion 12 toward a top of the second protrusion 12 in a direction from the front surface 51 to the back surface 53.

Figure 4:
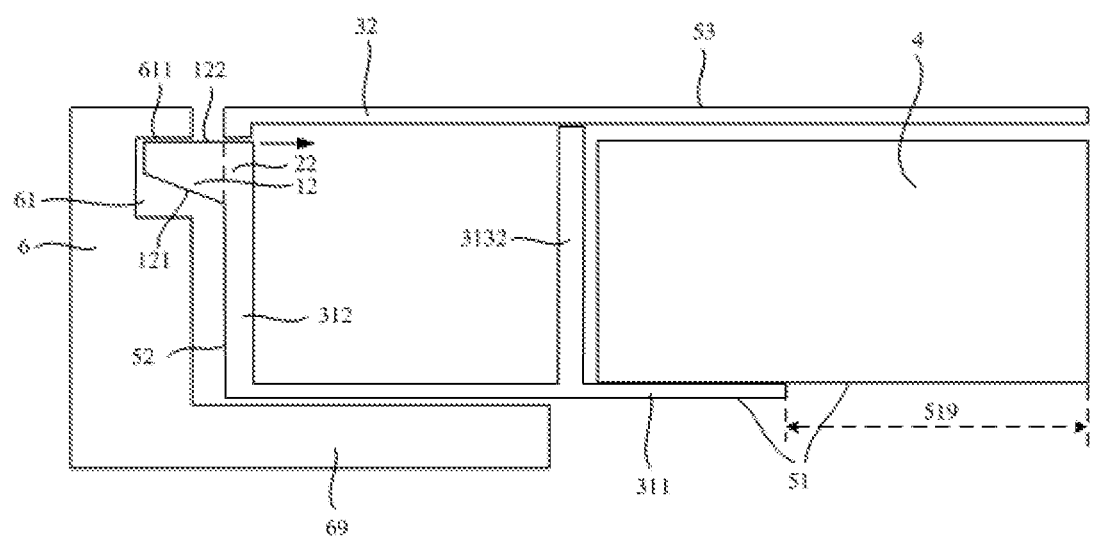
FIG. 4 is a topical sectional view of the display device at a second protrusion according to one embodiment of the present disclosure.

In other words, as shown in FIGS. 2 and 4, each second protrusion 12 may also be arranged on the corresponding elastic structure (i.e., the second elastic structure 22), and provided with an oblique surface (the second oblique surface 121) facing the front surface 51, so as to enable the second protrusion 12 to smoothly slide into the groove 61.

As shown in FIGS. 2 and 4, similar to the first elastic structure 21, the second elastic structure 22 may also be formed through a plurality of groups of second slits 3122. In addition, a second retainer wall 3132 may also be arranged at a side of the front member 311 of the middle frame 31 facing toward the back surface 53. The second retainer wall 3132 may be connected to the side member 312 at a position outside the corresponding group of second slits 3122. Hence, the second retainer wall 3132 may be in engagement with the rear cover 32, so as to define a partially closed space inside each group of second slits 3122, thereby to prevent moisture and oxygen from entering the display panel 5 through the second slits 3122.

In a possible embodiment of the present disclosure, each second protrusion 12 may be provided with a second contact surface 122 facing the back surface 53, the groove 61 may be provided with a third contact surface 611 to be in contact with the second contact surface 122, and the frame 6 may further include a clamping member 69 in contact with the front surface 51 of the display panel 5.

As shown in FIG. 4, the second contact surface 122 of the second protrusion 12 facing toward the back surface 53 may be in contact with the third contact surface 611 of the groove 61 facing the front surface 51, and the clamping member 69 of the frame 6 may be in engagement with the front surface 51 of the display panel 5. In this way, the display panel 5 may be clamped between the third contact surface 611 and the clamping member 69, without moving in an upper-lower direction as shown in FIG. 4.

Of course, it is merely necessary for the clamping member 69 to be arranged at several portions on the front surface 51 of the display panel 5, e.g., at positions corresponding to the first protrusions 11 and the second protrusions 12. In a possible embodiment of the present disclosure, the clamping member 69 may be of a complete ring shape in a plane parallel to the front surface 51.

Of course, in order to improve the structural strength and facilitate the demolding, as shown in FIG. 2, the second oblique surface 121 may not be a complete surface, and instead, the second oblique surface 121 may include a plurality of concaves.

Of course, the forms, quantity and position of the first clamping structures and the second clamping structure for connecting the display panel 4 to the frame 6 will not be particularly defined herein. For example, the display assembly may include a plurality of groups of first clamping structures and second clamping structures in different forms.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising:
a front surface, the front surface comprising a display region;
a back surface arranged opposite to the front surface;
a side surface between the front surface and the back surface;
at least one first clamping structure arranged at the side surface of the display panel, the at least one first clamping structure comprising:
a first elastic structure; and
a first protrusion arranged on the first elastic structure;
a housing comprising:
a middle frame comprising:
a front member arranged at the front surface of the display panel;
a side member arranged at the side surface of the display panel; and
an opening facing the back surface; and
a rear cover connected to the middle frame, the rear cover comprising a back member arranged at the back surface of the display panel; and
a display module arranged in the housing,
wherein a region surrounded by the front member is configured to expose a display surface of the display module to form the display region,
wherein the rear cover closes the opening on a back side of the middle frame and forms the back surface of the display panel,
wherein the rear cover encloses an entirety of the back surface of the display module on a side opposite to the display surface within the housing, and
wherein the side member comprises at least one group of first slits, each of the at least one group of first slits comprises two first slits spaced apart from each other, one end of each first slit extends to the opening, and a portion of the side member between the two first slits in each group of first slits forms the first elastic structure.

2. The display panel according to claim 1, wherein the first protrusion comprises a first oblique surface, the first oblique surface faces toward the front surface and is extended from a bottom of the first protrusion toward a top of the first protrusion in a direction from the front surface to the back surface.

3. The display panel according to claim 1, wherein the middle frame further comprises first retainer walls corresponding to the first elastic structures respectively, each first retainer wall is arranged at a side of the front member facing the back surface, two ends of the first retainer wall are connected to the side member outside the corresponding group of first slits respectively, a side of each first retainer wall away from the front member is in contact with the rear cover, and each first retainer wall is in engagement with the rear cover to define a partially closed space inside each of the at least one group of first slits.

4. The display panel according to claim 1, wherein the side surface comprises a first side surface and a second side surface arranged opposite to the first side surface, and each of the first side surface and the second side surface comprises the first clamping structure.

5. The display panel according to claim 4, wherein the side surface further comprises a third side surface and a fourth side surface arranged opposite to the third side surface, each of the third side surface and the fourth side surface is located between and connected with the first side surface and the second side surface, the first clamping structures are arranged at each of the third side surface and the fourth side surface.

6. The display panel according to claim 5, wherein the first clamping structures arranged at the two opposite side surfaces are symmetric relative to each other about a central axis of the display panel.

7. The display panel according to claim 1, wherein the side surface of the display panel comprises a plurality of first elastic structures, the plurality of first elastic structures is arranged at each side surface of the display panel, and the first protrusion is arranged on each of the first elastic structures.

8. The display panel according to claim 1, wherein a plurality of first protrusions is arranged on each of the first elastic structures.

9. The display panel according to claim 1, wherein at least one second clamping structure is arranged on the side surface of the display panel; the second clamping structure comprises a second protrusion and a second elastic structure arranged on a side surface of the display panel; the second protrusion is arranged on the second elastic structure.

10. A display device, comprising:
the display panel according to claim 1, and
a frame, at least surrounding the side surface of the display panel,
wherein the frame is arranged at least around the side surface in the case that the frame is connected to the display panel, the first clamping structure of the display panel is configured to be in physical contact with an inner side of the frame and keep a force between the first clamping and the inner side of the frame to enable the frame to be connected to the display panel;
wherein a top of the first protrusion is in contact with the inner side of the frame, and the first elastic structure is elastically deformed to change the force applied by the first protrusion to the inner side of the frame.

11. The display device according to claim 10, wherein the top of the first protrusion is a first contact surface, the first contact surface is in contact with the inner side of the frame and keeps a force between the first clamping and the inner side of the frame.

12. The display device according to claim 10, wherein at least one second clamping structure is arranged on the side surface of the display panel; the second clamping structure comprises a second protrusion and a second elastic structure, the second protrusion is arranged on the second elastic structure, the frame comprises at least one groove, and the groove is arranged on the inner side of the frame;
the number and position of the grooves on the inner side of the frame respectively correspond to the number and position of the second clamping structures of the display panel; the second protrusion of the second clamping structure is clamped into the groove.

13. The display device according to claim 12, wherein the second protrusion is provided with a second oblique surface facing toward the front surface and extending from a bottom of the second protrusion toward a top of the second protrusion in a direction from the front surface to the back surface.

14. The display device according to claim 13, wherein the second oblique surface comprises a plurality of concave.

15. The display device according to claim 12, wherein the middle frame further comprises second retainer walls corresponding to the second elastic structures respectively, each second retainer wall is arranged at a side of the front member facing the back surface, two ends of the second retainer wall are connected to the side member outside the corresponding group of second slits respectively, and a side of each second retainer wall away from the front member is in contact with the rear cover, each second retainer wall is in engagement with the rear cover to define a partially closed space inside each group of second slits.

16. The display device according to claim 12, wherein each second protrusion is provided with a second contact surface facing the back surface, the groove is provided with a third contact surface to be in contact with the second contact surface, and the frame further comprises a clamping member in contact with the front surface of the display panel.

17. The display device according to claim 16, wherein the clamping member is of a complete ring shape in a plane parallel to the front surface.

18. The display device according to claim 10, wherein the frame is made of wood.

\* \* \* \* \*